US 9,017,804 B2

(12) United States Patent
Loboda

(10) Patent No.: US 9,017,804 B2
(45) Date of Patent: Apr. 28, 2015

(54) METHOD TO REDUCE DISLOCATIONS IN SIC CRYSTAL GROWTH

(71) Applicant: Dow Corning Corporation, Midland, MI (US)

(72) Inventor: Mark Loboda, Bay City, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 13/937,149

(22) Filed: Jul. 8, 2013

(65) Prior Publication Data

US 2014/0220325 A1    Aug. 7, 2014

Related U.S. Application Data

(60) Provisional application No. 61/761,165, filed on Feb. 5, 2013.

(51) Int. Cl.
  *C30B 23/00*  (2006.01)
  *C30B 29/36*  (2006.01)

(52) U.S. Cl.
  CPC ............... *C30B 23/005* (2013.01); *C30B 29/36* (2013.01)

(58) Field of Classification Search
  CPC ........ C30B 29/36; C30B 23/02; C30B 25/02; H01L 21/02378; H01L 21/02576; H01L 21/02447; H01L 21/02529; H01L 21/02505
  USPC .......... 257/77; 428/141, 446; 117/84, 89, 92, 117/951; 438/478, 931
  See application file for complete search history.

(56) References Cited

U.S. PATENT DOCUMENTS 2,854,364 A    9/1958 Lely
3,691,694 A    9/1972 Goetz et al.
(Continued)

FOREIGN PATENT DOCUMENTS

CN    101724344    6/2010
CN    102107391    6/2011
(Continued)

OTHER PUBLICATIONS

Ioffe Physico-Technical Institute. "Electronic archive. New Semiconductor Materials. Characteristics and Properties. NSM Archive—Silicon Carbide (SiC)." http://www.ioffe.ru/SVA/NSM/Semicond/ accessed Aug. 29, 2013 (1998-2001): 1-72.
(Continued)

*Primary Examiner* — Maria Veronica Ewald
*Assistant Examiner* — Laura Auer
(74) *Attorney, Agent, or Firm* — Timothy J. Troy

(57) ABSTRACT

A method of forming an SiC crystal including placing a seed crystal of SiC in an insulated graphite container; placing a source of Si and C atoms in the insulated graphite container, where the source of Si and C atoms is for transport to the seed crystal to grow the SiC crystal; placing the container into the furnace; heating a furnace to a temperature from about 2,000° C. to about 2,500° C.; evacuating the furnace to a pressure from about 0.1 Torr and about 100 Torr; filling the furnace with an inert gas; and introducing dopant gas into the furnace with a controlled flow so as to form a plurality of stratified layers wherein each layer has dopant concentration different from a layer directly below and a layer directly above it. A 4H-SiC crystal made by the method. A 4H-SiC substrate cut from the SiC crystal made from the method.

23 Claims, 2 Drawing Sheets

(56) References Cited

U.S. PATENT DOCUMENTS

| | | | |
|---|---|---|---|
| 4,582,561 | A | 4/1986 | Ioku et al. |
| 4,855,254 | A | 8/1989 | Eshita et al. |
| 4,866,005 | A | 9/1989 | Davis et al. |
| 4,912,063 | A | 3/1990 | Davis et al. |
| 4,912,064 | A | 3/1990 | Kong et al. |
| 5,679,153 | A | 10/1997 | Dmitriev et al. |
| 5,709,745 | A | 1/1998 | Larkin et al. |
| 5,888,887 | A | 3/1999 | Li et al. |
| 5,895,583 | A | 4/1999 | Augustine et al. |
| 5,899,743 | A | 5/1999 | Kai et al. |
| 5,942,445 | A | 8/1999 | Kato et al. |
| 5,944,890 | A | 8/1999 | Kitou et al. |
| 5,954,881 | A | 9/1999 | Burk, Jr. et al. |
| 6,196,901 | B1 | 3/2001 | Minami |
| 6,352,927 | B2 | 3/2002 | Kishimoto |
| 6,534,026 | B2 | 3/2003 | Vodakov et al. |
| 6,562,127 | B1 | 5/2003 | Kud et al. |
| 6,579,359 | B1 | 6/2003 | Mynbaeva et al. |
| 6,583,050 | B2 | 6/2003 | Wenski et al. |
| 6,723,166 | B2 | 4/2004 | Kuhn et al. |
| 6,827,638 | B2 | 12/2004 | Kiuchi et al. |
| 6,861,360 | B2 | 3/2005 | Wenski et al. |
| 6,899,762 | B2 | 5/2005 | Wenski et al. |
| 7,081,420 | B2 | 7/2006 | Kamata et al. |
| 7,294,324 | B2 | 11/2007 | Powell et al. |
| 7,314,520 | B2 | 1/2008 | Powell et al. |
| 7,314,521 | B2 | 1/2008 | Powell et al. |
| 7,316,747 | B2 | 1/2008 | Jenny et al. |
| 7,323,051 | B2 | 1/2008 | Hobgood et al. |
| 7,399,217 | B1 | 7/2008 | Godshall |
| 7,422,634 | B2 | 9/2008 | Powell et al. |
| 7,438,760 | B2 | 10/2008 | Bauer et al. |
| 7,449,065 | B1 | 11/2008 | Powell et al. |
| 7,513,819 | B2 | 4/2009 | Kiuchi et al. |
| 7,531,433 | B2 | 5/2009 | Ellison et al. |
| 7,935,614 | B2 | 5/2011 | Schauer et al. |
| 8,075,647 | B2 | 12/2011 | Kawasaki et al. |
| 8,165,706 | B2 | 4/2012 | Pitney |
| 8,221,549 | B2 | 7/2012 | Maruyama |
| 8,384,090 | B2 | 2/2013 | Powell et al. |
| 8,395,164 | B2 | 3/2013 | Murphy et al. |
| 8,435,866 | B2 | 5/2013 | Nishiguchi et al. |
| 8,436,366 | B2 | 5/2013 | Harada et al. |
| 8,716,718 | B2 | 5/2014 | Momose et al. |
| 2002/0083892 | A1 | 7/2002 | Kondo et al. |
| 2003/0070611 | A1 | 4/2003 | Nakamura et al. |
| 2004/0081805 | A1 | 4/2004 | Furihata et al. |
| 2004/0134418 | A1 | 7/2004 | Hirooka |
| 2004/0266057 | A1 | 12/2004 | Nagasawa |
| 2005/0059247 | A1 | 3/2005 | Ikenaka |
| 2006/0102068 | A1 | 5/2006 | Tsvetkov et al. |
| 2006/0107890 | A1 | 5/2006 | Hobgood et al. |
| 2006/0118037 | A1 | 6/2006 | Powell et al. |
| 2006/0249073 | A1 | 11/2006 | Asaoka et al. |
| 2006/0267024 | A1 | 11/2006 | Murphy et al. |
| 2006/0289873 | A1* | 12/2006 | Rowland et al. ................ 257/77 |
| 2007/0176531 | A1 | 8/2007 | Kinoshita et al. |
| 2007/0221614 | A1 | 9/2007 | Sumakeris |
| 2007/0262322 | A1 | 11/2007 | Nakabayashi et al. |
| 2007/0290211 | A1 | 12/2007 | Nakayama et al. |
| 2008/0008641 | A1 | 1/2008 | Leonard et al. |
| 2008/0217627 | A1* | 9/2008 | Friedrichs et al. ............ 257/77 |
| 2008/0220620 | A1 | 9/2008 | Kawada et al. |
| 2008/0261401 | A1 | 10/2008 | Kerr et al. |
| 2008/0318359 | A1 | 12/2008 | Yonezawa et al. |
| 2009/0038541 | A1 | 2/2009 | Robbins et al. |
| 2009/0085044 | A1 | 4/2009 | Ohno et al. |
| 2009/0114148 | A1 | 5/2009 | Stahlbush et al. |
| 2009/0124060 | A1 | 5/2009 | Nagaya et al. |
| 2009/0134405 | A1* | 5/2009 | Ota et al. ................ 257/77 |
| 2009/0302328 | A1 | 12/2009 | Ohno et al. |
| 2009/0321747 | A1 | 12/2009 | Murphy et al. |
| 2009/0324896 | A1 | 12/2009 | Kato |
| 2010/0080956 | A1 | 4/2010 | Fujimoto et al. |
| 2010/0119849 | A1 | 5/2010 | Nakamura et al. |
| 2010/0291756 | A1 | 11/2010 | Haeberlen et al. |
| 2010/0295059 | A1 | 11/2010 | Fujimoto et al. |
| 2011/0031505 | A1 | 2/2011 | Harada et al. |
| 2011/0206929 | A1 | 8/2011 | Nakabayashi et al. |
| 2011/0233562 | A1 | 9/2011 | Harada et al. |
| 2011/0237078 | A1 | 9/2011 | Hirooka |
| 2011/0284871 | A1 | 11/2011 | Harada et al. |
| 2012/0025153 | A1 | 2/2012 | Hirose et al. |
| 2012/0031330 | A1 | 2/2012 | Tsumori et al. |
| 2012/0060751 | A1 | 3/2012 | Urakami et al. |
| 2012/0061686 | A1 | 3/2012 | Nishiguchi et al. |
| 2012/0070605 | A1 | 3/2012 | Sasaki et al. |
| 2012/0070968 | A1 | 3/2012 | Shibagaki et al. |
| 2012/0103249 | A1 | 5/2012 | Gupta et al. |
| 2012/0128892 | A1 | 5/2012 | Toyoda et al. |
| 2012/0184113 | A1 | 7/2012 | Inoue et al. |
| 2012/0241766 | A1 | 9/2012 | Ohtsuka et al. |
| 2012/0248463 | A1 | 10/2012 | Zhang |
| 2012/0280254 | A1 | 11/2012 | Muto et al. |
| 2012/0285370 | A1 | 11/2012 | Gupta et al. |
| 2013/0020585 | A1 | 1/2013 | Ishibashi |
| 2013/0029158 | A1 | 1/2013 | Aigo et al. |
| 2013/0032822 | A1 | 2/2013 | Ishibashi |
| 2013/0071643 | A1 | 3/2013 | Harada et al. |
| 2013/0099253 | A1* | 4/2013 | Ohtsuka et al. ................ 257/77 |
| 2013/0122692 | A1 | 5/2013 | Imai et al. |
| 2013/0126906 | A1 | 5/2013 | Tomita et al. |
| 2014/0054619 | A1 | 2/2014 | Burk et al. |

FOREIGN PATENT DOCUMENTS

| | | |
|---|---|---|
| CN | 102569055 | 7/2012 |
| CN | 102899723 | 1/2013 |
| DE | 102009016132 | 10/2010 |
| EP | 0712150 | 5/1996 |
| EP | 0795050 | 7/1999 |
| EP | 0967304 | 12/1999 |
| EP | 1039512 | 3/2000 |
| EP | 1179620 | 2/2002 |
| EP | 0954623 | 5/2002 |
| EP | 1215730 | 6/2002 |
| EP | 1225257 | 7/2002 |
| EP | 1288346 | 8/2002 |
| EP | 1255281 | 11/2002 |
| EP | 1306890 | 5/2003 |
| EP | 1354987 | 10/2003 |
| EP | 1403404 | 3/2004 |
| EP | 1143033 | 9/2004 |
| EP | 1491662 | 12/2004 |
| EP | 1243674 | 6/2005 |
| EP | 1659198 | 5/2006 |
| EP | 1739726 | 1/2007 |
| EP | 1785512 | 5/2007 |
| EP | 1852527 | 11/2007 |
| EP | 1855312 | 11/2007 |
| EP | 1751329 | 1/2008 |
| EP | 1901345 | 3/2008 |
| EP | 1828446 | 3/2010 |
| EP | 1721031 | 11/2010 |
| EP | 2264223 | 12/2010 |
| EP | 2314737 | 4/2011 |
| EP | 1752567 | 9/2011 |
| EP | 2371997 | 10/2011 |
| EP | 2385158 | 11/2011 |
| EP | 2394787 | 12/2011 |
| EP | 2395133 | 12/2011 |
| EP | 2405038 | 1/2012 |
| EP | 2420599 | 2/2012 |
| EP | 2484815 | 8/2012 |
| EP | 2490247 | 8/2012 |
| EP | 2557205 | 2/2013 |
| EP | 1797225 | 3/2013 |
| EP | 2570522 | 3/2013 |
| EP | 2584594 | 4/2013 |
| EP | 1790757 | 8/2013 |
| JP | H05-262599 | 10/1993 |
| JP | H06-316499 | 11/1994 |
| JP | 2003086518 | 3/2003 |
| JP | 2003086816 | 3/2003 |

(56) References Cited

FOREIGN PATENT DOCUMENTS

| | | |
|---|---|---|
| JP | 2004099340 | 4/2004 |
| JP | 2004292305 | 10/2004 |
| JP | 2005051299 | 2/2005 |
| JP | 2005064392 | 3/2005 |
| JP | 2006066722 | 3/2006 |
| JP | 2006120897 | 5/2006 |
| JP | 2007080770 | 3/2007 |
| JP | 2007131504 | 5/2007 |
| JP | 2007230823 | 9/2007 |
| JP | 2008001537 | 1/2008 |
| JP | 2008004888 | 1/2008 |
| JP | 2008053343 | 3/2008 |
| JP | 2008074661 | 4/2008 |
| JP | 2008115034 | 5/2008 |
| JP | 2009182126 | 8/2009 |
| JP | 2010228939 | 10/2010 |
| JP | 2010254520 | 11/2010 |
| JP | 2011020860 | 2/2011 |
| JP | 2011073915 | 4/2011 |
| JP | 2011233932 | 11/2011 |
| JP | 2012028565 | 2/2012 |
| JP | 2012246168 | 12/2012 |
| JP | 2013014469 | 1/2013 |
| KR | 100845946 | 7/2008 |
| WO | WO 9301914 | 2/1993 |
| WO | WO 9713013 | 4/1997 |
| WO | WO 0068474 | 11/2000 |
| WO | WO 0079570 | 12/2000 |
| WO | WO 0218670 | 3/2002 |
| WO | WO 2004014607 | 2/2004 |
| WO | WO 2005111277 | 11/2005 |
| WO | WO 2006031641 | 3/2006 |
| WO | WO 2006108191 | 10/2006 |
| WO | WO 2006135476 | 12/2006 |
| WO | WO 2007035570 | 3/2007 |
| WO | WO 2007058774 | 5/2007 |
| WO | WO 2007148486 | 12/2007 |
| WO | WO 2008033994 | 3/2008 |
| WO | WO 2008039914 | 4/2008 |
| WO | WO 2009003100 | 12/2008 |
| WO | WO 2009075935 | 6/2009 |
| WO | WO 2009080177 | 7/2009 |
| WO | WO 2009120505 | 10/2009 |
| WO | WO 2010041497 | 4/2010 |
| WO | WO 2010111473 | 9/2010 |
| WO | WO 2011034850 | 3/2011 |
| WO | WO 2011083552 A1 * | 7/2011 |
| WO | WO 2011126145 | 10/2011 |
| WO | WO 2011/142074 | 11/2011 |
| WO | WO 2011149906 | 12/2011 |
| WO | WO 2012/026234 * | 3/2012 |
| WO | WO 2012067112 | 5/2012 |
| WO | WO 2012144614 | 10/2012 |
| WO | WO 2013062380 | 5/2013 |

OTHER PUBLICATIONS

Chung, G., et al. "4H-SiC Epitaxy with Very Smooth Surface and Low Basal Plane Dislocation on 4 Degree Off-Axis Wafer." Materials Science Forum 679-380 (2011): 123-126.

Dmitriev, V., et al. "Growth of SiC and SiC-AlN solid solution by container-free liquid phase epitaxy." Journal of crystal growth 128.1 (1993): 343-348.

Gutkin, M., et al. "Micropipe Reactions in Bulk SiC Growth." Silicon Carbide—Materials, Processing and Applications in Electronic Devices (2011): 187-206.

Hecht, C., et al. "High-Performance Multi-Wafer SiC Epitaxy—First Results of Using a 10×100mm Reactor." Materials Science Forum 645-648 (2010): 89-94.

Hull, B., et al., "Development of Large Area (up to 1.5 cm2) 4H-SiC 10 kV Junction Barrier Schottky Rectifiers." Materials Science Forum 600-603 (2008): 931-934.

Kimoto, T., et al. "Homoepitaxial growth of 4H—SiC (033¯8) and nitrogen doping by chemical vapor deposition." Journal of crystal growth 249.1 (2003): 208-215.

Lendenmann, H., et al. "Operation of a 2500V 150A Si-IGBT / SiC Diode Module." Materials Science Forum 338-342 (2000): 1423-1426.

Neudeck, P. "Electrical impact of SiC structural crystal defects on high electric field devices." Materials Science Forum 338-342 (2000): 1161-1166.

Neudeck, P., et al. "Performance limiting micropipe defects in silicon carbide wafers." Electron Device Letters, IEEE 15.2 (1994): 63-65.

Ogunniyi, A., et al. "The benefits and current progress of SiC SGTOs for pulsed power applications." Solid-State Electronics 54.10 (2010): 1232-1237.

Powell, J., et al. "Process-Induced Morphological Defects in Epitaxial CVD Silicon Carbide." physica status solidi (b) 202.1 (1997): 529-548.

Powell, J., et al. "Sources of Morphological Defects in SiC Epilayers." Transactions Third International High-Temperature Electronics Conference, Sandia National Laboratories 1 (1996): II-3-II-8.

Sanchez, E., et al. "Thermal decomposition cavities in physical vapor transport grown SiC." Materials Science Forum 338.1 (2000): 55.58.

Tairov, Y., et al. "General principles of growing large-size single crystals of various silicon carbide polytypes." Journal of Crystal Growth 52 (1981): 146-150.

Tairov, Y., et al. "Progress in controlling the growth of polytypic crystals." Progress in Crystal Growth and Characterization 7.1 (1983): 111-162.

Thomas, B., et al. "Properties and suitability of 4H-SiC epitaxial layers grown at different CVD systems for high voltage applications." Materials Science Forum 457-460 (2004): 181-184.

Tupitsyn, E., et al. "Controllable 6H—SiC to 4H-SiC polytype transformation during PVT growth." Journal of Crystal Growth 299.1 (2007): 70-76.

Wagner, G., et al. "Vapour phase growth of epitaxial silicon carbide layers." Progress in crystal growth and characterization of materials 47.2 (2003): 139-165.

Wan, J., et al. "A comparative study of micropipe decoration and counting in conductive and semi-insulating silicon carbide wafers." Journal of Electronic Materials. 34.10 (2005): 1342-1348.

Wan, J., et al. "A New Method of Mapping and Counting Micropipes in SiC Wafers." Materials Science Forum 527-529 (2006): 447-450.

Wan, J., et al. "Scaling of chlorosilane SiC CVD to multi-wafer epitaxy system." Materials Science Forum 556-557 (2007): 145-148.

Wolf, S., et al. Silicon Processing for the VLSI Era. vol. 1—Process Technology. Ch. 1: Silicon: Single-Crystal Growth and Wafering (1986): 1-35.

Zhou, L., et al. "Chemomechanical polishing of silicon carbide." Journal of the Electrochemical Society 144.6 (1997): L161-L163.

Levinshtein, M., et al. (eds.). Properties of Advanced Semiconductor Materials: GaN, AlN, InN, BN, SiC, SiGe. Ch. 5: Silicon Carbide (SiC) (2001): 93-147.

Chen, Y., et al. "Studies of the Distribution of Elementary Threading Screw Dislocations in 4H Silicon Carbide Water." Materials Science Forum 600-603 (2007): 31-304.

Gupta, A., et al. "Status of Large Diameter SiC Single Crystals." Materials Science Forum 717-720 (2012): 3-8.

Ioffe Physico-Technical Institute. "Electronic archive. New Semiconductor Materials. Characteristics and Properties. NSM Archive—Silicon Carbide (SiC)." http://www.ioffe.ru/SVA/NSM/Semicond/ accessed Aug. 29, 2013 (1998-2001).

Larkin, D., et al. "Site-competition epitaxy for superior silicon carbide electronics." Applied Physics Letters 65.13 (1994): 1659-1661.

Maximenko, S., et al. "Open core dislocations and surface energy of SiC." Materials Science Forum 527-529 (2006): 439-442.

Mynbaeva, M., et al. "Chemical vapor deposition of 4H-SiC epitaxial layers on porous SiC substrates." Applied Physics Letters 78.1 (2001): 117-119.

Powell, A., et al. "Large Diameter 4H-SiC Substrates for Commercial Power Applications." Materials Science Forum 457-460 (2004): 41-46.

Schulze, N., et al. "Near-equilibrium growth of micropipe-free 6H-SiC single crystals by physical vapor transport." Applied Physics Letters 72.13 (1998): 1632-1634.

(56) References Cited

OTHER PUBLICATIONS

International Application No. PCT/US2013/077189, International Search Report and Written Opinion, Mar. 21, 2014; 16 pages.
Chen, W., and M. A. Capano. "Growth and characterization of 4H-SiC epilayers on substrates with different off-cut angles." Journal of Applied Physics 98.11 (2005): 114907; 6 pages.
International Application No. PCT/US2013/077285, International Search Report and Written Opinion, Apr. 7, 2014; 15 pages.
International Application No. PCT/US2013/077291, International Search Report and Written Opinion, Apr. 4, 2014; 16 pages.
International Application No. PCT/US2013/059064, International Search Report and Written Opinion, Nov. 18, 2013.
Yashiro, H., et al. "Development of Lapping and Polishing Technologies of 4H-SiC Wafers for Power Device Applications." Materials Science Forum 600-603 (2009): 819-822.
International Application No. PCT/US2013/058996, International Search Report and Written Opinion, Nov. 27, 2013.
Myers R L et al., "High Epitaxial Growth Rate of 4H-SiC using Horizontal Hot-Wall CVD," *Materials Science Forum Trans Tech Publications Switzerland*, vol. 527-529, 2006, pp. 187-190, XP002728678, ISSN: 0255-5476.
Kordina et al., "SiC epitaxial growth on larger area substrates: History and evolution", Silicon Carbide Epitaxy, 2012, pp. 1-25.

\* cited by examiner

METHOD TO REDUCE DISLOCATIONS IN SIC CRYSTAL GROWTH

RELATED APPLICATION

This application claims priority benefit from U.S. Provisional Application Ser. No. 61/761,165, filed on Feb. 5, 2013.

BACKGROUND

1. Field

The disclosed invention relates to manufacturing of silicon carbide (SiC) crystals and wafers.

2. Related Art

Silicon carbide, SiC, is a crystalline semiconductor material, recognized by those familiar with materials science, electronics and physics as being advantageous for its wide band gap properties and also for extreme hardness, high thermal conductivity and chemical inert properties. These properties make SiC a very attractive semiconductor for fabrication of power semiconductor devices, enabling power density and performance enhancement over devices made from more common materials like silicon.

The most common forms of SiC consist of cubic or hexagonal arrangements of atoms. The stacking of Si and C layers can take on many forms, known as polytypes. The type of silicon carbide crystal is denoted by a number denoting the number of repeat units in the stacking sequence followed by a letter representing the crystalline format. For example the 3C-SiC polytype refers to a repeat unit of 3 and a cubic (C) lattice, while a 4H-SiC polytype refers to repeat unit of 4 and a hexagonal (H) lattice.

The different silicon carbide polytypes have some variations in materials properties, most notably electrical properties. The 4H-SiC polytype has the relatively larger bandgap while the 3C-SiC has a smaller bandgap, with the bandgaps for most other polytypes falling in between. For high performance power device applications when the bandgap is larger, the material is more capable, in theory, to offer relatively higher power and thermal conductivity performance.

SiC crystals do not occur in nature and as such must be synthesized. Growth of SiC crystals can be executed by sublimation or chemical vapor deposition.

Growth of SiC by sublimation (also referred to as Physical Vapor Transport—PVT) is very challenging. Temperatures in excess of 2,000° C. are required to generate vapor stream of Si/C species by sublimation, which places great limitations on the reaction cell components and the furnace design. Originally SiC abrasive materials formed by processes like the Acheson method were used as the source of the Si and C atoms for the crystal, and as the technology matured groups developed means to synthesize SiC source powder specifically for SiC crystal growth. The growth is usually performed in a graphite container within a vacuum chamber. The graphite container is heated by either resistive methods or induction methods. The container is insulated in a careful manner so as to create controlled temperature gradients within the volume. A seed crystal is used, which is usually shaped like a plate or disc. The seed crystal is typically oriented with its growth surface facing the source material. The location of the seed crystal in the container is designed such that when the container is heated, the seed is at a relatively lower temperature position, while the Si—C source materials are at the higher temperature position. When the container is heated to a temperature sufficient to sublime the source material, the vapors will travel towards the low temperature region and condense on the seed crystal. While this appears simple in concept, in practice the growth of SiC is very complicated and recognized by those who practice as very difficult to perform.

Historically, initial progress in SiC sublimation-based crystal growth is described first by Lely (U.S. Pat. No. 2,854, 364) whose method of unseeded crystal growth resulted in small hexagonal SiC platelets. In the 1970s and 1980s the art to produce the first crystals of size attractive for producing devices was done in Russia by Tairov and Tsvetkov (Journal of Crystal Growth, 52 (1981) p. 146-50 and *Progress in Controlling the Growth of Polytypic Crystals in Crystal Growth and Characterization of Polytype Structures*, P. Krishna, ed., Pergammon Press, London, p. 111 (1983)). Their approach used a Lely crystal as a seed, and conducted growth by sublimation and transport as described above. These results showed methods for polytype control by choice of seeds, pressure control and temperature gradients. Later, Davis (U.S. Pat. No. 4,866,005) revealed improvements by judicious selection of source materials and gradient controls. Refinements on the methods of Tairov, Tsvetkov and Davis continue to be revealed to this day.

When methods to produce larger crystals emerged, focus also moved to control defects in the crystals. Defects can be categorized as inclusions and crystal dislocations. The primary crystalline defects in SiC crystals are screw dislocations. Among these are a special case known as a micropipe or hollow core screw dislocations. Additionally, there are basal plane dislocations and threading edge dislocations. These defects originate from many sources. For example, defects contained in the seed crystal can be passed to the newly grown crystal volume. Stresses arising from temperature gradients and thermal expansion mismatch and imparted to the seed and the crystal during growth can result in formation of dislocations. Deviation of the stoichiometry in the sublimation vapor stream from that needed to form SiC can result in unstable polytype growth—in turn leading to polytype inclusions in the grown crystal, which lead to dislocation formation at the polytype boundaries. Even interactions between dislocations can create or eliminate dislocations.

SiC crystals produced by methods identified have large concentrations of dislocations. As of this filing, the commonly reported values of screw dislocation and basal plane concentration are nominally 5,000-10,000/cm², respectively. The dislocations are most commonly assessed by sectioning the crystal in the plane normal to the crystal axis of symmetry. Etching the exposed crystal surface with molten salt, like potassium hydroxide, at temperatures in the 350-500° C. range will reveal the dislocations. Each dislocation type has a unique shape so they can be uniquely counted. The dislocations are commonly counted and reported as a number divided by the inspection area. This characterization method is useful as it allows for easy correlation of defects contained in planar semiconductor devices formed on the crystal plane. There are many examples in the literature which show that dislocations are not uniformly distributed in the plane of observation. The large count of dislocations makes it very impractical to count every single one, especially as today inspections can be required on sections greater than or equal to the equivalent of 100 mm diameter circles. So the etched area is sampled to determine the amount of dislocations. Incorrect sampling methods can lead to errors in the estimation of the dislocation concentration associated with larger crystals. In most reports, the details of the sampling method are not provided, so replication of reported results can often be difficult, if not impossible.

Scientists experienced in solid state physics and semiconductor devices know that dislocations result in device performance below the theoretical properties of the material. Therefore, modern effort focused on improvements of semiconductor SiC crystal quality look to identify and control the factors which can reduce defects originating in crystal growth.

Once large enough crystals are produced, the crystal must be cut and fabricated into wafers in order to be useful to fabricate semiconductor devices using planar fabrication methods. As many semiconductor crystals (e.g., silicon, gallium arsenide) have been successfully developed and commercialized into wafer products, the methods to fabricate wafers from bulk crystals are known. A review of the common approaches to, and requirements for wafer fabrication and standard methods of characterization, can be found in Wolf and Tauber, Silicon Processing for the VLSI Era, Vol. 1—Process Technology, Chapter 1 (Lattice Press—1986).

Due to its hardness, fabrication of SiC into wafer substrates presents unique challenges compared to processing other common semiconductor crystals like silicon or gallium arsenide. Modifications must be made to the machines and the choices of abrasives must be changed beyond commonly used materials. It has been reported that substantial subsurface damage is observable on mirror polished SiC wafers, and this can be reduced or removed by using chemical enhanced mechanical polishing methods similar to that used in the silicon industry (Zhou, L., et al., *Chemomechanical Polishing of Silicon Carbide*, J. Electrochem. Soc., Vol. 144, no. 6, June 1997, pp. L161-L163).

In order to build semiconductor devices on SiC wafers, additional crystalline SiC films must be deposited on the wafers to create the device active regions with the required conductivity value and conductor type. This is typically done using chemical vapor deposition (CVD) methods. Techniques for growth of SiC by CVD epitaxy have been published from groups in Russia, Japan and the United States since the 1970's. The most common chemistry for growth of SiC by CVD is a mixture of a silicon containing source gas (e.g., monosilanes or chlorosilanes) and a carbon containing source gas (e.g., a hydrocarbon gas). A key element to growth of low defect epitaxial layers is that the substrate surface is tilted away from the crystal axis of symmetry to allow the chemical atoms to attach to the surface in the stacking order established by the substrate crystal. When the tilt is not adequate, the CVD process will produce three dimensional defects on the surface, and such defects will result in non-operational semiconductor devices. Surface imperfections, such as cracks, subsurface damage, pits, particles, scratches or contamination will interrupt the replication of the wafer's crystal structure by the CVD process (see, for example, Powell and Larkin, *Phys. Stat. Sol.* (b) 202, 529 (1997)). It is important that the polishing and cleaning processes used to fabricate the wafer minimize surface imperfections. In the presence of these surface imperfections several defects can be generated in the epitaxial films including basal plane dislocations and cubic SiC inclusions (see for example, Powell, et. al. *Transactions Third International High-Temperature Electronics Conference*, Volume 1, pp. II-3-II-8, Sandia National Laboratories, Albuquerque, N. Mex USA, 9-14 Jun. 1996).

Defects in SiC are known to limit or destroy operation of semiconductor devices formed over the defects. Neudeck and Powell reported that hollow core screw dislocations (micropipes) severely limited voltage blocking performance in SiC diodes (P. G. Neudeck and J. A. Powell, *IEEE Electron Device Letters*, vol. 15, no. 2, pp. 63-65 (1994)). Neudeck reviewed the impact of crystal (wafer) and epitaxy originated defects on power devices in 1994, highlighting limitations of power device function due to screw dislocations and morphological epitaxy defects (Neudeck, *Mat. Sci. Forum*, Vols 338-342, pp. 1161-1166 (2000)). Hull reported shift to lower values in the distribution of high voltage diode reverse bias leakage current when the diodes were fabricated on substrates having lower screw dislocation density (Hull, et. al., *Mat. Sci. forum*, Vol. 600-603, p. 931-934 (2009)). Lendenmann reported forward voltage degradation in bipolar diodes was linked to basal plane dislocations in the epilayer that originate from basal plane dislocations in the substrate (Lendenmann et. al., *Mat. Sci. Forum*, Vols 338-342, pp. 1161-1166 (2000)).

Modern technology for growth of 4H-SiC crystals has not been successful to develop a commercial method for a crystal growth process that allows simultaneous control over the gamut of dislocation types. Various methods disclosed in the prior art are often lacking detail regarding the specific steps employed in the crystal growth or the methods employed to assess the concentration of defects and demonstrate repeatability. At this point in time, a method to produce a SiC crystal with diameter larger than 76 mm and having low values of micropipes, screw dislocations and basal plane dislocations has not been disclosed.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Embodiments disclosed herein provide methods to reduce micropipes, screw and basal plane dislocations in SiC crystals via sublimation crystal growth. The method involves controlling the early stages of crystal growth to form several layers where the doping concentration changes each layer. The same doping element is used for each layer. Dislocations are converted interfaces of these layers and will eventually dissociate or exit the crystal at the side walls. The result is a crystal with micropipes, screw and/or basal plane dislocations lower than that in the starting seed. A new seed is harvested from the crystal and is used in a subsequent growth. This process is repeated to reduce the total dislocations in the crystal to a desired level.

4H-SiC crystals can be grown using seeds of diameter as small as 76 mm or up to and exceeding 150 mm diameter.

Aspects of the invention provide a method of forming an SiC crystal, the method comprising: placing a seed crystal of SiC in a graphite container; surrounding the container with insulating graphite, placing a source of silicon and carbon atoms in the insulated graphite container, wherein the source of silicon and carbon atoms is for transport to the seed crystal to grow the SiC crystal; placing the container into the furnace; heating a furnace to a temperature between about 2,000° C. and about 2,500° C.; evacuating the furnace to a pressure from about 10 Torr to about 100 Torr; filling the furnace with an inert gas; introducing nitrogen gas into the furnace with a controlled flow so as to form: a first deposited layer having a thickness of about 0.1 µm to about 1,000 µm, wherein the first deposited layer has a first nitrogen concentration of between about 0.9 and about 10 times a nitrogen concentration of the seed crystal; a second deposited layer having a thickness of about 0.1 µm to about 1,000 µm, wherein the second deposited layer has a second nitrogen concentration less than the nitrogen concentration of the seed crystal; a third deposited layer having a thickness of about 0.1 µm to about 1,000 µm, wherein the third deposited layer has a third nitrogen concentration greater than the first nitrogen concentration and not larger than from about 0.9 to about 100 times the nitrogen concentration of the seed crystal; and, in a pressure range of 0.1-100 torr, a last deposited layer having a thickness of about 0.1 mm to about 50 mm, wherein the last deposited layer has a nitrogen concentration from about $1\times10^{15}/cm^3$ to about $1\times10^{19}/cm^3$.

Other aspects provide a seed crystal which is a 4H-SiC crystal having an offcut from 0 to 4 degrees toward (11-20) crystalline orientation and wherein the nitrogen concentration of the seed crystal is from about $1\times10^{16}/cm^3$ to about $8\times10^{18}/cm^3$.

Further aspects provide a 4H-SiC substrate that has an averaged micropipe density of less than about $1/cm^2$, wherein the 4H-SiC substrate has a screw dislocation density of less than about $5,000/cm^2$, and wherein the 4H-SiC substrate has a basal plane dislocation density of less than about $5,000/cm^2$ as determined from at least 9 measurements made on the 4H-SiC substrate. All metrics achieved simultaneously.

Yet further aspects provide a SiC crystal, the SiC crystal comprising: a seed crystal formed from a bulk crystal of SiC; a first deposited layer formed over and in contact with the seed crystal and having a thickness of about 0.1 µm to about 1,000 µm, wherein the first deposited layer has a first nitrogen concentration of from about 0.9 and about 10 times a nitrogen concentration of the seed crystal; a second deposited layer formed over and in contact with the first deposited layer and having a thickness of about 0.1 µm to about 1,000 µm, wherein the second deposited layer has a second nitrogen concentration less than the nitrogen concentration of the seed crystal; a third deposited layer formed over and in contact with the second deposited layer and having a thickness of about 0.1 µm to about 1,000 µm, wherein the third deposited layer has a third nitrogen concentration greater than the first nitrogen concentration and not larger than from about 0.9 to about 100 times the nitrogen concentration of the seed crystal; and, a bulk deposited layer having a thickness of about 0.1 mm to about 50 mm, wherein the bulk deposited layer has a bulk nitrogen concentration from about $1\times10^{15}/cm^3$ to about $1\times10^{19}/cm^3$.

Another aspect provides a system for forming an SiC crystal, the system comprising: a graphite container configured for supporting a seed crystal and sources of Si and C atoms for transport to the seed crystal to grow the SiC crystal; a heater for heating a furnace to a temperature from about 2,000° C. and about 2,500° C.; a means for evacuating the furnace to a pressure from about 0.1 Torr and about 100 Torr; a gas delivery system for filling the furnace with an inert gas; a controller preprogrammed to introduce nitrogen gas into the furnace with a variable flow configured to: form a first deposited layer having a thickness of about 0.1 µm to about 1,000 µm, wherein the first deposited layer has a first nitrogen concentration of from about 0.9 and about 10 times a nitrogen concentration of the seed crystal; form a second deposited layer having a thickness of about 0.1 µm to about 1,000 µm, wherein the second deposited layer has a second nitrogen concentration less than the nitrogen concentration of the seed crystal; form a third deposited layer having a thickness of about 0.1 µm to about 1,000 µm, wherein the third deposited layer has a third nitrogen concentration greater than the first nitrogen concentration and not larger than from about 0.9 to about 100 times the nitrogen concentration of the seed crystal; and, form a bulk deposited layer having a thickness of about 0.1 mm to about 50 mm, wherein the bulk deposited layer has a nitrogen concentration from about $1\times10^{15}/cm^3$ to about $1\times10^{19}/cm^3$.

Further aspects provide an SiC crystal having stratified layer of distinct nitrogen concentration, the SiC crystal comprising: a seed crystal; a plurality of stratified layers, each layer having distinct nitrogen concentration that is different from a layer directly below it and a layer directly above it; and, a bulk layer having nitrogen concentration between about $1\times10^{15}/cm^3$ to about $1\times10^{19}/cm^3$.

Further aspects provide a method for forming an SiC crystal with low dislocation count, comprising: placing an SiC seed crystal inside a vapor transport furnace; placing sources of silicon and carbon atoms inside the vapor transport furnace; operating the furnace to cause vapor transport of Si and C atoms from the sources towards the seed crystal; and, varying nitrogen flow into the vapor transport furnace to thereby form a growth of stratified SiC layers on the seed crystal, the stratified SiC layers being stratified such that each layer has different nitrogen concentration different from a layer directly below and a layer directly above it.

Other aspects and features of the invention would be apparent from the detailed description, which is made with reference to the following drawings. It should be appreciated that the detailed description and the drawings provides various non-limiting examples of various embodiments of the invention, which is defined by the appended claims.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

Figure 3:
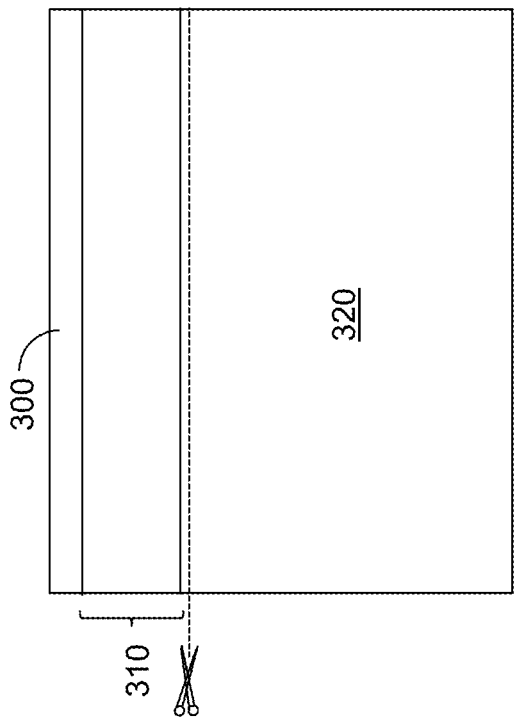
FIG. 3 is a schematic illustrating the seed with the growth according to embodiment of the invention.

The following provides examples of fabrication methods according to embodiments of the invention, which result in substrates of relatively large diameter while exhibiting low micropipes, screw and basal plane dislocations densities. The examples below relate to using nitrogen as donor dopant, but similar process can be implemented using acceptor dopants, such as Boron (B), Phosphorus (P) and Aluminum (Al).

Note that this discussion relates to dislocation formed in the bulk crystal grown by PVT, not to thin film layers later formed over a crystal wafer by epitaxial CVD. Growth of the bulk by PVT happens in islands, which is a three-dimensional process, whereas epitaxial CVD growth on SiC is a two-dimensional, step flow growth process. Also, the reactants in a PVT process are metal vapors, while in epitaxial CVD the reactants are hydrides or chlorides. Due to the differences between PVT and CVD, the closure of micropipes in epitaxial CVD is driven by overgrowth of the open core, and a CVD process cannot reduce the concentration of 1c screw dislocations (closed core). In PVT dislocation reduction is primarily managed by controlling the stress distribution in the crystal as it grows.

According to the following embodiments, the process begins with an SiC seed, which is generally in the shape of a circular wafer of similar diameter as the grown crystal. The seed crystals are polished and/or etched on the carbon face to insure that the surface is free of mechanical damage. The seed crystal can be coated on the side opposite the growth surface with a material which is stable at the growth temperatures. The presence of a protective carbon coating can help to suppress deterioration of the seed during the crystal growth process, as voids ("thermal evaporation cavities") may form in the seed when the protection is absent. The SiC seed forms the seed layer upon which further layers are grown as described below.

Next a graphite reaction cell of cylindrical shape is filled on the bottom with solid sources for Si and C vapor. The sources can be either SiC powder or a mixture of Si granules and carbon powder. A seed crystal of SiC is placed at the top of the graphite reaction cell. The graphite container is sealed with the matching threaded lid. The container is surrounded by insulating graphite felt or foam, the arrangement of which is designed to keep the seed at a slightly lower temperature than the powder. The container is placed into an induction furnace. The furnace is evacuated and backfilled with a non oxidizing gas such as argon. Pressure is established at near atmospheric pressure (500-700 torr) and the container is heated to approximately 1,600-2,500° C.

The pressure is subsequently reduced to initiate the vapor transport process. In this method, the pressure is first reduced to the range of 10-100 torr. Doping gas, in this example a nitrogen gas, is added to the furnace.

The first deposit of material on the seed crystal results in a layer that is of comparable, but most advantageously has higher average nitrogen concentration that the nitrogen concentration in the seed. Specifically, improved results can be obtained if the nitrogen concentration is on average comparable or higher, and up to ten times higher, than nitrogen concentration of the seed. This first layer can be 1-1,000 microns (μm) in thickness. Having the nitrogen concentration in the first layer higher than that of the seed is part of the mechanism which reduces dislocations. Experience has shown that if the first layer is lower in nitrogen than the seed, more dislocations will form. It is noted that the first layer is the nucleation layer; it plays a different role than the following layers since it is growing on a virgin seed surface. Thus, controlling nitrogen concentration on the first layer relates to reducing the nucleation of micropipes. On the other hand, controlling the concentration of nitrogen in the following layers relate to controlling stresses, as will be described below.

The nitrogen flow is then reduced by a specified amount to control the nitrogen concentration in the second layer. That is, the nitrogen flow is controlled such that a second layer will form with nitrogen concentration lower than the first. This second layer can be 1-1,000 microns (μm) in thickness.

The nitrogen flow is then increased by a specified amount to control the nitrogen concentration in the third layer. That is, the nitrogen flow is controlled such that a third layer will form with nitrogen concentration higher than the second layer, but not exceeding the concentration in the seed crystal. The nitrogen concentration is increased in the third layer so as to control the stress in the growing crystal. Specifically, as layers switch between low doping and high doping, the stress at the interface changes is nature—when low doped layer is grown over high doped layer the stress in that layer is compressive, and when high doped layer is grown over low doped layer the stress in that layer is tensile. Additionally, if the target doping in the first layer is a bit off, it may be recovered with the appropriate doping in the third layer.

The processes for layers 2 and 3 can be repeated as many times as necessary to eliminate the dislocations. The pressure and temperature can be altered in each layer as needed to achieve optimal reduction of dislocations.

Once the dislocation reduction layers are deposited, the last layer should be formed with nitrogen concentration near the value of the seed layer.

At this point the pressure, temperature and nitrogen flow are altered for the conditions needed to form the remainder of the crystal. The thickness of the remaining crystal grown is in the range of 5-50 mm, which forms the bulk layer that would be later sliced into wafers that can be used either for device fabrication of polished to be used as a seed for another growth. Typical values of pressure are in the range of 0.1-10.0 torr and temperature in the range of 2,000-2,500° C.

At the end of the growth process, the pressure is raised to approximately 600 torr. This suppresses any more vapor transport. The furnace is then cooled to room temperature. When the container is opened, a single crystal of SiC with the same polytype as the seed crystal has formed on the seed crystal.

New seeds can be created from crystals grown by this method and used to prepare new crystals. It is found that each generation of crystals grown shows reduced dislocation density.

The features of the above described embodiment provide a crystal having nitrogen stratified layers structure, and as such, the method can be integrated into any strategy to grow large (diameter >76 mm, length >25 mm) crystals. Each resulting crystal can be sliced to provide several seeds for repeating the process, such that each subsequent growth exhibits fewer dislocations and can be again sliced to generate better seeds until the desired dislocation density is reached.

To assess the dislocations in the crystal, the crystal is sliced and all slices are polished. Micropipes can be tested by first revealing them with molten salt etching and counting via manual and automated methods, or by scanning the polished slice with a laser light scattering spectrometer and an image processing algorithm to count the micropipes. Methods such as this are described in J. Wan, et. al., "A New Method of Mapping and Counting Micropipes in SiC Wafers" Proc. 2005 Intl Conf. On SiC and Related Materials, Materials Science Forum (2006), p. 447, and J. Wan, et, al., "A Comparative Study of Micropipe Decoration and Counting in Conductive and Semi-Insulating Silicon Carbide Wafers," J. Electronic Materials, Vol. 34 (10), p. 1342. Once the total number of defects is counted, this value is divided by the area of the slice measured to derive a defect density in counts per unit area.

Screw dislocations and basal plane dislocations require either molten salt etching as described above or x-ray topography. Counting is generally done by sampling several areas on the slice and counting the defects. The method typically used to report defects consists of a measurement at the center of the wafer, four sites 90 degrees apart at 50% of the wafer radius and four sites 90 degrees apart at >80% of the wafer radius, and rotated 45 degrees to the points at 50% of the radius. The total counts in each site are summed, and then the sum is divided by the measurement area to derive a defect density in counts per unit area. Since the sampling method of larger wafers is important to assessing the wafer, it is often pertinent to report the site count values as well as the net count of defects.

Figure 1:
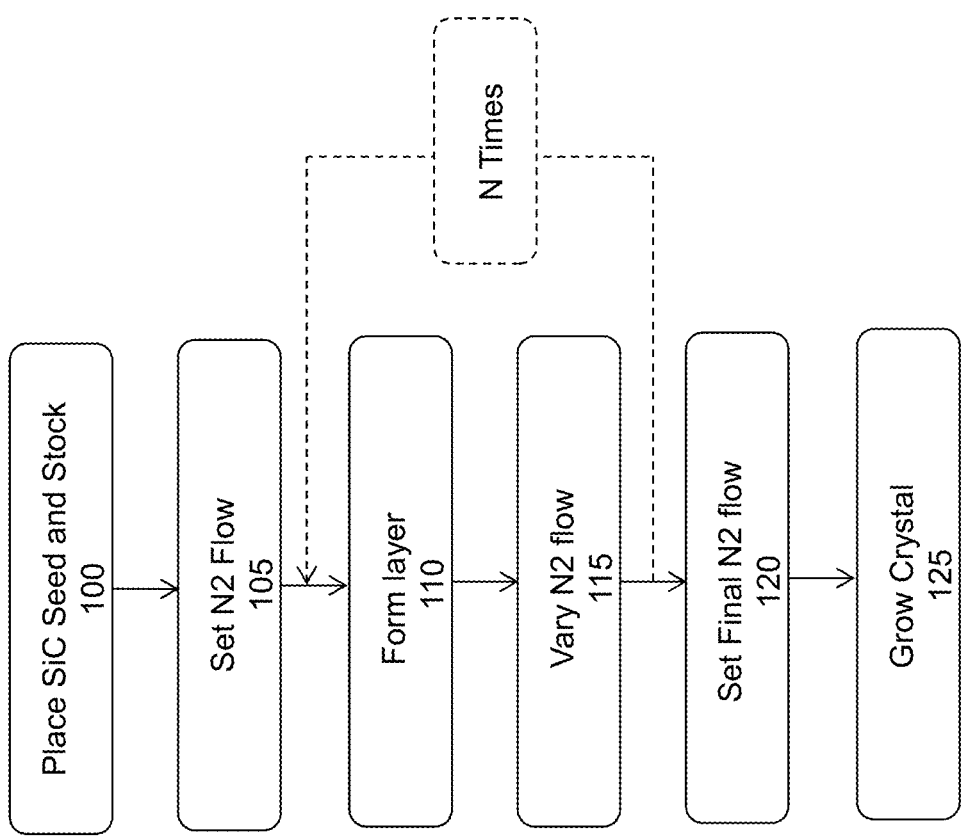
FIG. 1 is a flow chart illustrating a method according to one embodiment.

FIG. 1 is a flow chart illustrating a method according to one embodiment. The method may include one or more of the following steps: step 100 starts by placing SiC seed and stock inside the reaction vessel. The reaction vessel is placed inside a vacuum furnace, which is vacuum pumped and heated to reaction temperature. At step 105 the initial dopant flow, here it is nitrogen ($N_2$) flow is set and at step 110 the first layer is formed using the initial nitrogen flow. At step 155 the $N_2$ flow is varied and the growth continues to form another layer having nitrogen concentration resulting from the varied nitrogen flow. In this example, the varied nitrogen flow is set to result in lower nitrogen concentration in the second layer. Varying the nitrogen flow and growing subsequent layer can be repeated N times in step 115. Thereafter, at step 120, the final $N_2$ flow is set and at 125 the process proceeds to grow the bulk of the crystal. In this example, the growth is not stopped between the various nitrogen flow settings.

Figure 2:
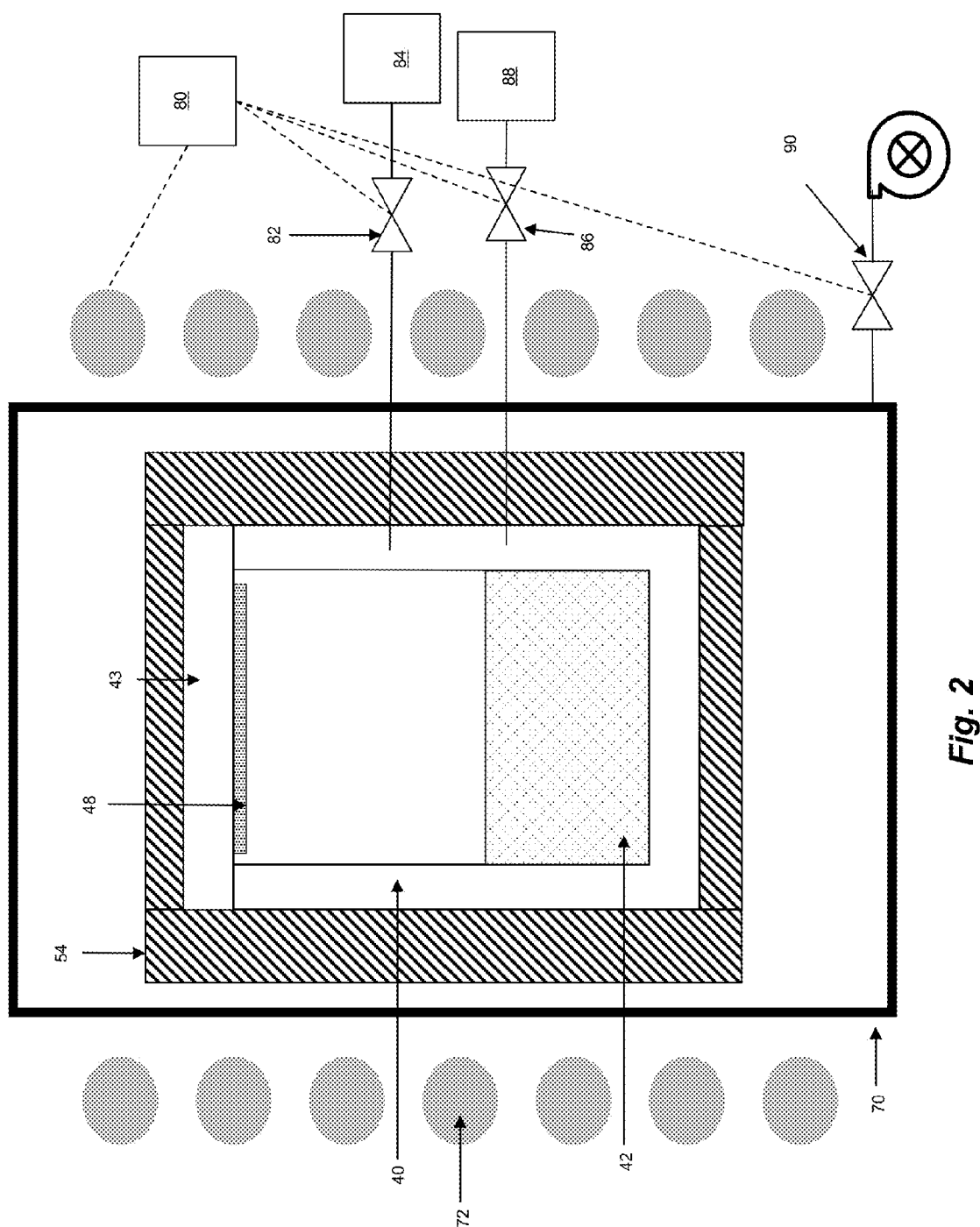
FIG. 2 shows an arrangement for growth of SiC crystals by physical vapor transport, the arrangement including a controller for controlling a valve to a nitrogen source, a valve to an argon source, a vacuum line and a heater.

FIG. 2 shows an arrangement for growth of SiC crystals by physical vapor transport, according to one embodiment. A PVT reaction cell 40 having lid 43 is illustrated, which is configured for SiC crystal growth. The reaction cell is preferably formed from a graphite vessel. Granulized SiC or a mixture of pulverized silicon and carbon powder 42 is placed in the bottom of the cell. Positioned in the upper portion of the vessel is a seed crystal 48 mounted to the inside of the top of the cell. The entire vessel is surrounded with insulation 54 such as graphite felt or foam. The reaction cell 40 is placed in a vacuum furnace 70. The vacuum furnace 70 may be comprised of steel if the cell is resistively heated, or it may be comprised of glass if the cell is inductively heated. In the embodiments shown, the vacuum furnace is comprised of glass and is heated by an RF induction coil 72.

The arrangement for growth of SiC crystals can include a controller 80 for controlling a valve 82 to a nitrogen source 84, which is connected to the vacuum furnace 70, and for controlling a valve 86 to an argon source 88, also connected to the vacuum furnace 70. The vacuum inside vacuum furnace 70 is controlled by valve 90 leading to vacuum pump 92. In this embodiment, controller 80 is configured to control vacuum valve 90 and pump 92 so as to maintain a user-set vacuum level inside the vacuum furnace 70, regardless of argon and/or nitrogen flow into the vacuum furnace. For example, if nitrogen flow into the chamber is increased, controller 80 opens the vacuum valve 90 to increase vacuum pumping from the furnace and maintain the set vacuum level. Controller 80 also controls the operation of the heater, such as the power applied to RF induction coil 72.

Once the cell 40 is loaded with the source material 42 and seed 48, it is sealed and is placed into an RF induction furnace 70. The furnace is evacuated using pump 92, thereby creating a pressure differential between the interior of the furnace 70 and the interior of the cell 40. However, cell 40 is constructed such that the lid does not seal the cell fully hermetically and so, gaseous matter from inside the cell 40 leaks to the interior of furnace 70 and is pumped out. Similarly, the walls of cell 40 are somewhat porous to gases and leak into the interior of furnace 70. Consequently, the pumping action of pump 92 also evacuates the interior of cell 40 by creating the pressure differential between the interior of cell 40 and the interior of furnace 70.

Once the interior of cell 40 and furnace 70 have been evacuated, the interior of furnace 70 is backfilled with a non-oxidizing gas such as argon from argon source 88. Pressure is established near atmospheric pressure (500-700 torr) by controlling vacuum valve 90, and the container is heated to approximately 1,600-2,500° C. by energizing coils 72.

The pressure is subsequently reduced to initiate the vapor transport process. In this method, the pressure is first reduced to the range of 10-100 torr. Nitrogen gas is then added to the furnace to control the conductivity of the grown crystal, but regardless of nitrogen flow, the controller maintains the pressure at the set value, i.e., in the range of 10-100 torr. At this point, the pressure, temperature and nitrogen flow are controlled to achieve the conditions needed to form a first layer of SiC, having nitrogen concentration of between about 0.9 and about 10 times a nitrogen concentration of the seed crystal. After a predetermined growth period, the nitrogen flow is changed in order to continue crystal growth and form a second deposited layer having a thickness of about 0.1 μm to about 1,000 μm, wherein the second deposited layer has a second nitrogen concentration less than the nitrogen concentration of the seed crystal. The second layer can be deposited at the same pressure or different pressure than the first layer. This layering process can repeat multiple times. For example, the nitrogen flow can be varied again to continue crystal growth to form a third deposited layer having a thickness of about 0.1 μm to about 1,000 μm, wherein the third deposited layer has a third nitrogen concentration greater than the first nitrogen concentration and not larger than between about 0.9 and about 100 times the nitrogen concentration of the seed crystal. Once the desired stratified layer has been grown, the pressure may be reduced to the range of 0.1-10 torr and the nitrogen flow is adjusted so as to grow a last deposited layer having a thickness of about 0.1 mm to about 50 mm, wherein the last deposited layer has a nitrogen concentration between about $1\times10^{15}/cm^3$ to about $1\times10^{19}/cm^3$. This layer forms the bulk SiC crystal growth on the seed. The thickness of the remaining crystal grown is in the range of 5-50 mm. At the end of the growth process, the pressure is raised to approximately 600 torr. This suppresses any more vapor transport. The furnace is then cooled to room temperature. When the container is opened, a single crystal of SiC with the same polytype as the seed crystal has formed on the seed crystal. The above growth steps, including pressure, temperature, argon and nitrogen flows, growth time, etc. can be pre-programmed into controller 80, so that the controller 80 can execute the growth process automatically.

FIG. 3 is a schematic illustrating the seed with the growth made according to embodiments of the invention. Stratified layers 310 are grown over seed 300, such that each of the stratified layers has distinct average dopant concentration that is different from a layer directly below it and a layer directly above it. However, since the growth is done inside the reaction cell, the changes in doping concentrations are graded as opposed to a step change. The stratified layers 310 comprise as many layers as desired, such that defects are minimized. After completion of the growth of the stratified layers, the growth process proceeds to form the bulk SiC crystal 320, having the desired doping level. Note that the dopant in all of the stratified layers and the bulk SiC crystal is the same. In some embodiments, the doping in the bulk SiC crystal 320 is at the same level as the doping in the seed 300.

As shown by the scissors caricature, the resulting ingot is cut, such that the bulk SiC crystal 320 is separated from the seed 300 and stratified layer 310, which are generally discarded. In practice, rather than separating the bulk SiC crystal 320 as shown by the caricature, the ingot is simply sliced into SiC wafers, but only the wafers cut from the bulk SiC crystal 320 are used. Also, new seeds can be created by slicing the crystals grown by this method, i.e., slicing the bulk SiC crystal 320, and the new seeds can be used to grow new crystals. It is found that each generation of crystals grown shows reduced dislocation density.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

The invention claimed is:

1. An SiC crystal ingot comprising:
   a seed crystal;
   a plurality of deposited layers formed over the seed crystal by physical vapor transport, each of the deposited layers having an average dopant concentration that is different from a layer directly below it or a layer directly above it; and
   a bulk layer deposited over the plurality of deposited layers by physical vapor transport, the bulk layer having a thickness of more than 0.1 mm and configured to be sliced into wafers;
   wherein the bulk layer has dopant concentration from $1 \times 10^{15}/cm^3$ to $1 \times 10^{19}/cm^3$;
   wherein the plurality of deposited layers alternate between low doping and high doping, such that a low doped layer is grown over a high doped layer and a high doped layer is grown over a low doped layer; and,
   wherein the seed crystal, the plurality of deposited layers, and the bulk layer together form a single SiC crystal ingot.

2. The SiC crystal of claim 1, wherein the dopant comprises nitrogen.

3. The SiC crystal of claim 1, wherein the dopant comprises one of Boron, (B), Phosphorus (P) and Aluminum (Al).

4. The SiC crystal of claim 1, wherein a first layer of the plurality of deposited layers is formed directly on the seed crystal and has a thickness of 100 μm to 1,000 μm, and has a first average dopant concentration of 0.9 to 10 times an average dopant concentration of the seed crystal.

5. The SiC crystal of claim 1, wherein a first layer of the plurality of deposited layers is formed directly on the seed crystal and has a thickness of 0.1 μm to 1,000 μm, and has a first average dopant concentration equal to or higher than a average dopant concentration of the seed crystal.

6. The SiC crystal of claim 5, further comprising a second deposited layer over the first deposited layer and having a dopant concentration lower than the first deposited layer.

7. The SiC crystal of claim 6, further comprising a third deposited layer over the second deposited layer and having a dopant concentration higher than the second layer, but not exceeding the concentration in the seed crystal.

8. The SiC crystal of claim 6, wherein the second deposited layer has a thickness of 0.1 μm to 1,000 μm, and wherein the second deposited layer has an average nitrogen concentration less than the average nitrogen concentration of the seed crystal.

9. The SiC crystal of claim 7, wherein the third deposited layer has a thickness of 0.1 μm to 1,000 μm, and wherein the third deposited layer has an average nitrogen concentration greater than the first deposited layer and not larger than from 0.9 to 100 times the average nitrogen concentration of the seed crystal.

10. The SiC crystal of claim 7, wherein the bulk deposited layer has a thickness of up to 50 mm.

11. The SiC crystal of claim 1, wherein the bulk deposited layer has an average micropipe density of less than $1/cm^2$, has a screw dislocation density of less than $5,000/cm^2$, and has a basal plane dislocation density of less than $5,000/cm^2$ as determined from at least 9 measurements made on the 4H-SiC substrate.

12. The SiC crystal of claim 1, wherein the seed crystal is a 4H-SiC crystal having an offcut of 0 to 4 degrees toward (11-20) and wherein the average nitrogen concentration of the seed crystal is $1 \times 10^{16}/cm^3$ to $8 \times 10^{18}/cm^3$.

13. An SiC crystal ingot comprising:
   a seed crystal;
   a plurality of deposited layers formed over the seed crystal by physical vapor transport, each of the deposited layers having an average nitrogen concentration that is different from a layer directly below it or a layer directly above it; and
   a bulk layer deposited over the plurality of deposited layers by physical vapor transport, the bulk layer having a thickness of more than 0.1 mm and configured to be sliced into wafers;
   wherein the bulk layer having a nitrogen concentration from $1 \times 10^{15}/cm^3$ to $1 \times 10^{19}/cm^3$; and,
   wherein the plurality of deposited layers comprise:
   a first deposited layer that is of same or higher nitrogen concentration than in the seed crystal;
   a second deposited layer having a nitrogen concentration lower than the first deposited layer; and,
   a third deposited layer over the second deposited layer and having a nitrogen concentration higher than the second layer; and,
   wherein the seed crystal, the plurality of deposited layers, and the bulk layer together form a single SiC crystal ingot.

14. The SiC crystal of claim 13, wherein the third deposited layer has a nitrogen concentration not exceeding the concentration in the seed crystal.

15. The SiC crystal of claim 13, wherein the plurality of deposited layers comprises a stratified layer having the second deposited layer and the third deposited layer repeated a plurality of times.

16. The SiC crystal of claim 13, wherein the first layer has a thickness of 0.1 μm to 1,000 μm, and has an average nitrogen concentration of 0.9 to 10 times the average nitrogen concentration of the seed crystal.

17. The SiC crystal of claim 13, wherein the third deposited layer has an average nitrogen concentration greater than the first deposited layer and not larger than from 0.9 to 100 times the average nitrogen concentration of the seed crystal.

18. The SiC crystal of claim 13, wherein the bulk deposited layer has a thickness of up to 50 mm.

19. The SiC crystal of claim 13, wherein the bulk deposited layer has an average micropipe density of less than $1/cm^2$, has a screw dislocation density of less than $5,000/cm^2$, and has a basal plane dislocation density of less than $5,000/cm^2$ as determined from at least 9 measurements made on the 4H-SiC substrate.

20. The SiC crystal of claim 13, wherein the seed crystal is a 4H-SiC crystal having an offcut of 0 to 4 degrees toward (11-20) and wherein the average nitrogen concentration of the seed crystal is $1 \times 10^{16}/cm^3$ to $8 \times 10^{18}/cm^3$.

21. The SiC crystal of claim 1, wherein the seed crystal has a diameter of greater than or equal to 76 mm.

22. The SiC crystal of claim 1, wherein the seed crystal has a diameter of greater than or equal to 150 mm.

23. The SiC crystal of claim 1, wherein the seed crystal has a diameter of greater than or equal to 76 mm and less than or equal to 150 mm.

\* \* \* \* \*